United States Patent [19]
Kanterakis et al.

[11] Patent Number: 6,021,157
[45] Date of Patent: *Feb. 1, 2000

[54] FAST PHASE ESTIMATION IN DIGITAL COMMUNICATION SYSTEMS

[75] Inventors: Emmanuel Kanterakis, North Brunswick, N.J.; Sorin Davidovici, Jackson Heights, N.Y.

[73] Assignee: Golden Bridge Technology, Inc., West Long Beach, N.J.

[*] Notice: This patent is subject to a terminal disclaimer.

[21] Appl. No.: 09/016,324

[22] Filed: Jan. 30, 1998

Related U.S. Application Data

[63] Continuation of application No. 08/700,012, Aug. 20, 1996, Pat. No. 5,742,637.

[51] Int. Cl.$^7$ .............................. H04K 1/00; H04L 27/22; H03D 3/22
[52] U.S. Cl. ...................... 375/200; 375/324; 375/329; 329/304
[58] Field of Search ..................... 375/200, 324, 375/327, 329, 269, 376, 279, 280, 332; 329/308, 307, 304; 455/205, 334, 337

[56] References Cited

U.S. PATENT DOCUMENTS

| | | | |
|---|---|---|---|
| 4,024,342 | 5/1977 | Croisier et al. | 375/268 |
| 4,112,372 | 9/1978 | Holmes et al. | 325/321 |
| 4,164,628 | 8/1979 | Ward et al. | 179/15 |
| 4,279,018 | 7/1981 | Carson | 364/514 |
| 4,285,060 | 8/1981 | Cobb et al. | 375/1 |
| 4,320,531 | 3/1982 | Dimon | 455/203 |
| 4,392,232 | 7/1983 | Andren et al. | 375/86 |
| 4,538,280 | 8/1985 | Mosley, Jr. et al. | 375/1 |
| 4,559,499 | 12/1985 | Bursztejn et al. | 329/50 |
| 4,621,365 | 11/1986 | Chiu | 375/1 |
| 4,630,283 | 12/1986 | Schiff | 375/1 |
| 4,649,549 | 3/1987 | Halpern et al. | 380/32 |
| 4,653,069 | 3/1987 | Roeder | 380/31 |
| 4,672,629 | 6/1987 | Beier | 375/1 |
| 4,691,326 | 9/1987 | Tsuchiya | 375/1 |
| 4,730,340 | 3/1988 | Frazier, Jr. | 375/1 |
| 4,841,545 | 6/1989 | Endo et al. | 375/1 |
| 4,860,307 | 8/1989 | Nakayama | 375/1 |
| 4,912,722 | 3/1990 | Carlin | 375/1 |
| 5,068,876 | 11/1991 | Yoshikawa et al. | 375/324 |
| 5,497,400 | 3/1996 | Carson et al. | 375/324 |
| 5,521,548 | 5/1996 | Sugawara | 375/324 |
| 5,627,861 | 5/1997 | Katanka | 375/324 |

*Primary Examiner*—Young T. Tse
*Assistant Examiner*—Betsy L. Deppe
*Attorney, Agent, or Firm*—David Newman Chartered

[57] ABSTRACT

A system and method for synchronizing a Costas Loop for demodulating a received spread-spectrum signal having data and a first arbitrary phase angle, $\phi(t)$, using a phase detector, a phase unwrapping subsystem, an oscillator, a derotator and a decision device. A second arbitrary phase angle, $\theta(t)$, is generated from an in-phase component and a quadrature-phase component of the received spread-spectrum signal. The second arbitrary phase angle, $\theta(t)$, is proportional to the first arbitrary phase angle, $\phi(t)$. A value of $\theta$ proportional to $\theta(t)$ is then estimated. The estimated $\theta$ value is processed to obtain an estimate for the $\phi$ value, and a cosine and a sine of the estimated $\phi$ value are generated by the oscillator. The derotator derotates the in-phase-component and the quadrature-phase component of the received spread-spectrum signal with the cosine and the sine of the estimated $\theta$ value to generate a demodulated signal. The decision device evaluates the demodulated signal and outputs data.

12 Claims, 14 Drawing Sheets

FAST PHASE ESTIMATION IN DIGITAL COMMUNICATION SYSTEMS

BACKGROUND OF THE INVENTION

This patent is a continuation of U.S. patent application entitled, FAST PHASE ESTIMATION IN DIGITAL COMMUNICATION SYSTEMS having Ser. No. 08/700,012 and filing date Aug. 20, 1996 now U.S. Pat. No. 5,742,637. The benefit of the earlier filing date of the parent patent applications is claimed pursuant to 35 U.S.C. § 120.

This invention relates to spread-spectrum communications, and more particularly to a fast acting Costas loop for minimizing phase synchronization time.

DESCRIPTION OF THE RELEVANT ART

A received spread-spectrum signal at the input to a spread-spectrum receiver can be represented as:

$$r(t)=d(t)\, g(t)\, \cos\{\omega_o t+\phi(t)\}$$

where $d(t)$ is the data, $g(t)$ is the pseudonoise (PN) spreading sequence, $\omega_o$ equals $2\pi f_o$ where $f_o$ is the carrier frequency, and $\phi(t)$ is an unknown phase. Typically $\phi(t)$ varies with time as a result of Doppler shifts caused by motion and/or fading.

The spread-spectrum receiver amplifies the received spread-spectrum signal and converts it, preferably to baseband, as in-phase, $I(t)$, and quadrature-phase, $Q(t)$, components for processing:

$$I(t) = d(t)\, g(t)\, \cos\{\phi(t)\}$$

$$Q(t) = d(t)g(t)\sin\{\phi(t)\}$$

Several spread-spectrum systems transmit a reference, often called a "pilot" or "generic" signal or channel, $g_o(t) \cos\{\omega_o t+\phi(t)\}$, which lacks data. Synchronizing to the reference signal using a pilot channel is relatively easy and allows the estimation and removal of $\phi(t)$, which is necessary for coherent detection.

The use of transmitted reference signals was practiced in the 1950's. In the 1960's it was found that the reference signal could be derived directly from the received spread-spectrum signal, $r(t)$, with no decrease in performance. One such reference signal technique is the Costas loop.

A typical Costas loop is shown in FIG. 1 to illustrate this point.

The Costas loop in FIG. 1 employs a voltage-controlled oscillator 11 with in-phase and quadrature-phase outputs which are multiplied by product devices 15, 16, respectively, to produce baseband in-phase and quadrature-phase terms, $I_1$ and $Q_1$. The in-phase and quadrature-phase terms are multiplied by product device 14 to remove amplitude variation. The product is then filtered by lowpass filter 13 to remove noise. When $\phi=\theta$, a result obtained approximately after filtering, $I_1=d(t)g(t)$ and $Q_1=0$. The signal therefore has been synchronized and coherent detection is possible. The Costas loop of FIG. 1 takes considerable time to achieve lock since the voltage-controlled oscillator 11 starts with an arbitrary phase and the lowpass filter 13 is very narrowband. Values for $I_1$ and $Q_1$ are computed, and the product formed. If the product were not zero, then the product is filtered and a new value of $\phi(t)$ is generated. This process continues until the correct value of $\phi(t)$ is obtained at which time synchronization occurs.

SUMMARY OF THE INVENTION

A general object of the invention is a method and apparatus for minimizing phase synchronization time in order to respond to rapid Doppler shifts.

Another object of the invention is a fast acting Costas loop.

According to the present invention, as embodied and broadly described herein, a method and improvement to a voltage-controlled oscillator is provided for synchronizing a Costas loop for demodulating a received spread-spectrum signal. The received-spread-spectrum signal is modulated with binary-phase-shift-keying (BPSK) modulation and has data, $d(t)$, a chip sequence, $g(t)$, and a first arbitrary phase angle, $\phi(t)$, varying with time variable, $t$. A receiver generates an in-phase component and a quadrature-phase component of the received-spread-spectrum signal. A matched filter has an impulse response matched to the chip sequence, $g(t)$, embedded in the received spread-spectrum signal.

The method comprises the steps of removing the BPSK modulation from the in-phase component and from the quadrature-phase component of the received spread-spectrum signal, and then filtering the in-phase component and the quadrature-phase component of the received spread-spectrum signal. This filtering step typically generates a second arbitrary phase angle $\theta(t)$, where $\theta(t) =2\phi(t)$. Other relationships may be used however. An estimated value of $\theta$ proportional to the second arbitrary phase angle, $\theta(t)$, is determined from the filtered in-phase component and the filtered quadrature-phase component of the received spread-spectrum signal. The steps further include processing the estimated $\theta$ value, thereby obtaining an estimate of the $\phi$value, determining a cosine of the estimated $\phi$ value and a sine of the estimated $\phi$ value, and derotating the in-phase component and the quadrature-phase component of the received spread-spectrum signal using the cosine of the estimated $\phi$value and the sine of the estimated $\phi$value, to generate a demodulated signal. Data are decided from the demodulated signal.

Additional objects and advantages of the invention are set forth in part in the description which follows, and in part are obvious from the description, or may be learned by practice of the invention. The objects and advantages of the invention also may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate preferred embodiments of the invention, and together with the description serve to explain the principles of the invention.

DETAILED DESCRIPTION OF THE PREFERRED EMBODIMENTS

Figure 1:
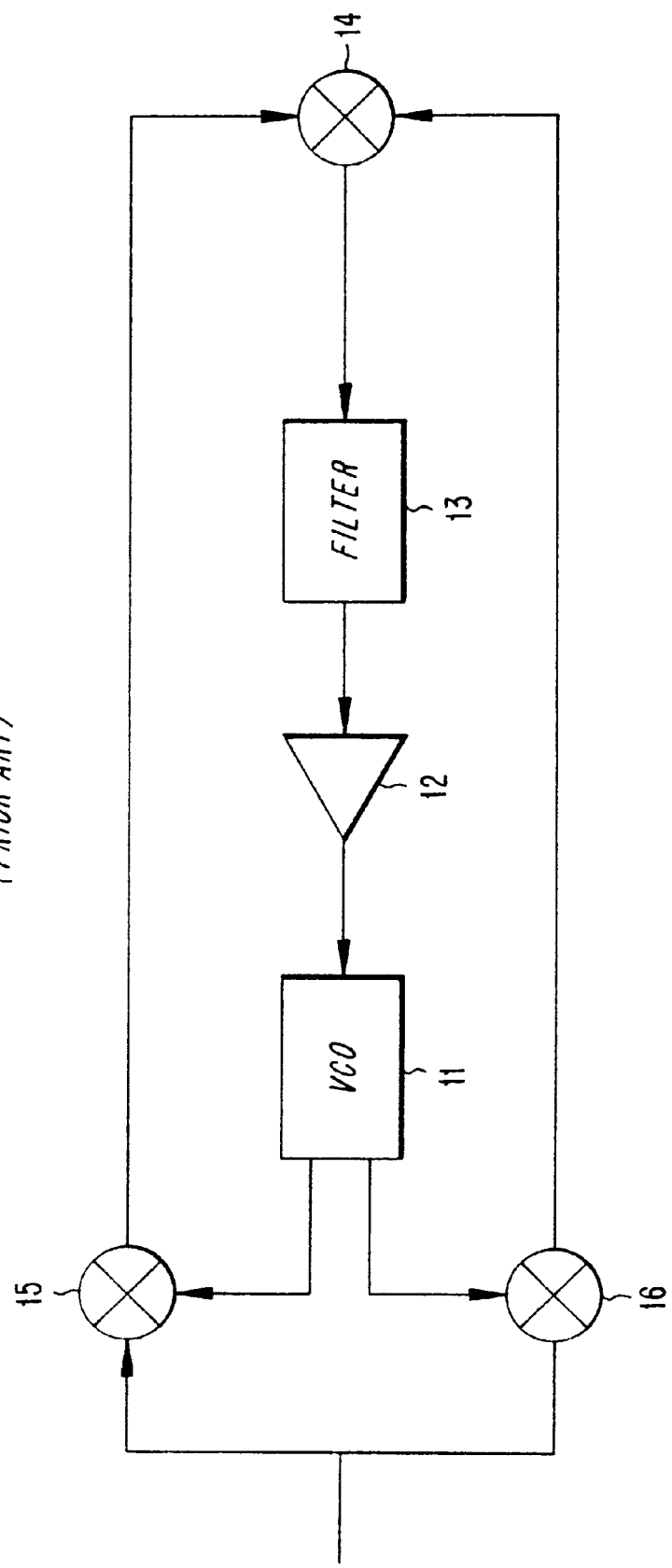
FIG. 1 is a block diagram of a prior art phase-locked-loop circuit.

Reference now is made in detail to the present preferred embodiments of the invention, examples of which are illustrated in the accompanying drawings, wherein like reference numerals indicate like elements throughout the several views.

The present invention provides a method for synchronizing a Costas loop to demodulate a received spread-spectrum signal, r(t). The received spread-spectrum signal is modulated with binary-phase-shift-keying (BPSK) modulation and has a data signal, d(t), a chip-sequence signal, g(t), and an arbitrary first phase angle, φ(t), varying with time variable, t. The first arbitrary phase angle, φ(t), is assumed to vary due to Doppler. Here it is assumed that the data modulation is BPSK. This invention could be easily extended to include M-ary PSK by using a higher order nonlinearity. For BPSK modulation signals, a square law type nonlinearity is sufficient.

A receiver generates an in-phase component and a quadrature-phase component of the received-spread-spectrum signal, r(t). In-phase and quadrature-phase radio frequency (RF) and intermediate frequency (IF) circuits are well known in the art. The receiver preferably, although not necessarily, shifts the content of the received-spread-spectrum signal to baseband.

The method comprises the steps of removing the BPSK modulation from the in-phase component and the quadrature phase component of the received spread-spectrum signal, and filtering the in-phase component and the quadrature-phase component of the received spread-spectrum signal to generate a second arbitrary phase angle, φ(t), proportional to φ(t), where θ(t)=2φ(t). The method then comprises the step of estimating a θ value proportional to the second arbitrary phase angle, θ(t), from the filtered in-phase component and the filtered quadrature-phase component of the received spread-spectrum signal. The step of estimating the θ value may include the step of determining an arctangent of the in-phase component and the quadrature-phase component of the received spread-spectrum signal. The steps then include processing the estimated φ value, thereby estimating the φ value, determining a cosine of the estimated φ value and a sine of the estimated φ value, and derotating the in-phase component and the quadrature-phase component of the received spread-spectrum signal using the cosine of the estimated φ value and the sine of the estimated φ value, to generate a demodulated signal. Data are determined from the demodulated signal and output from the receiver.

Given a received-spread-spectrum signal $$r(t)=d(t)\, e^{j\phi(t)}+n(t)$$

the digital version of this signal may be represented as:

$$r_i=d_i e^{j\phi_i}+n_i$$

where the first arbitrary phase angle, φ(t), is estimated so that the data, d(t), can be estimated. The first arbitrary phase angle, φ(t), is assumed to vary at a much slower rate than the data signal, d(t).

A simple way to estimate the first arbitrary phase angle φ(t), or equivalently the function $e^{j\phi(t)}$, is to estimate d(t) first, use the estimate, d̂(t), to remove the modulation d(t), and then estimate $e^{j\phi(t)}$ by low pass filtering the product, d̂(t)r(t). If d̂(t)=d(t) then, in the noiseless case, the filtered product becomes $$f(t)=F\{\hat{d}(t)\, r(t)\}=e^{j\phi(t)}$$

This method works well when the channel is stationary, or there is a provision for a periodic restart of the underlying algorithm. A problem arises when the estimate, d̂(t), is considerably different from d(t). When this occurs, the estimate of $e^{j\phi(t)}$ also is very noisy which in turn worsens the next estimate of d(t). The algorithm has difficulty converging to the true estimates of d(t) and $e^{j\phi(t)}$ even in the case when the channel is clear. A restart of the algorithm by periodically inserting known data into the channel can bring the algorithm back to normal operation.

Methods which do not rely on estimating the transmitted data use a nonlinearity to remove the modulation without distorting the information on $e^{j\phi(t)}$ A Costas loop forms an error signal which is proportional to the difference between the first arbitrary phase angle φ(t) and a locally generated estimate of the first arbitrary phase angle φ̂(t). This difference is used in a feedback configuration to bring the estimate of the first arbitrary phase angle φ̂(t) closer to the first arbitrary phase angle φ(t), thus reducing the error. This closed loop system in general is very difficult to analyze and control. Simple filtering of the error signal produces a closed loop system whose guaranteed convergence is limited by the capability to analyze nonlinear control systems. Ample time has to be allocated for the loop to achieve convergence. For systems in which transmissions occur intermittently, a substantial time may need to be allocated to obtain the initial estimate of the first arbitrary phase angle φ(t).

A much simpler method described herein is based on squaring the incoming waveform. Given that the modulation is binary phase shift keying (BPSK), the squaring operation removes the BPSK modulation from the received signal. In the extreme case where the noise is insignificant, the squared signal is $$r^2(t)=e^{j2\phi(t)}$$

The first arbitrary phase angle, φ(t), can be obtained by processing the function, 2φ(t). The π radians uncertainty in calculating the estimate, φ̂(t), of φ(t) does not pose any problem since the data are assumed differentially encoded before transmission. For moderate to low signal-to-noise ratios (SNR), filtering of $r^2(t)$ is necessary. In this case, the signal $$r^2(t)=e^{j2\phi(t)}+n^2(t)+2n(t)d(t)e^{j\phi(t)}$$

has the noise components $n^2(t)$ and $2n(t)d(t)e^{j\phi(t)}$ which could be reduced in power by filtering since the bandwidths of the noise components are normally much higher than the bandwidth of $e^{2j\phi(t)}$. Filtering $r^2(t)$ does not produce adverse effects in the estimation of θ(t) since $e^{2j\phi(t)}$ is normally a well behaving function of time.

Let the filtered $r^2(t)$ function be defined by $$s(t)=F\{r^2(t)\}\approx e^{j\theta(t)}$$

Figure 2:
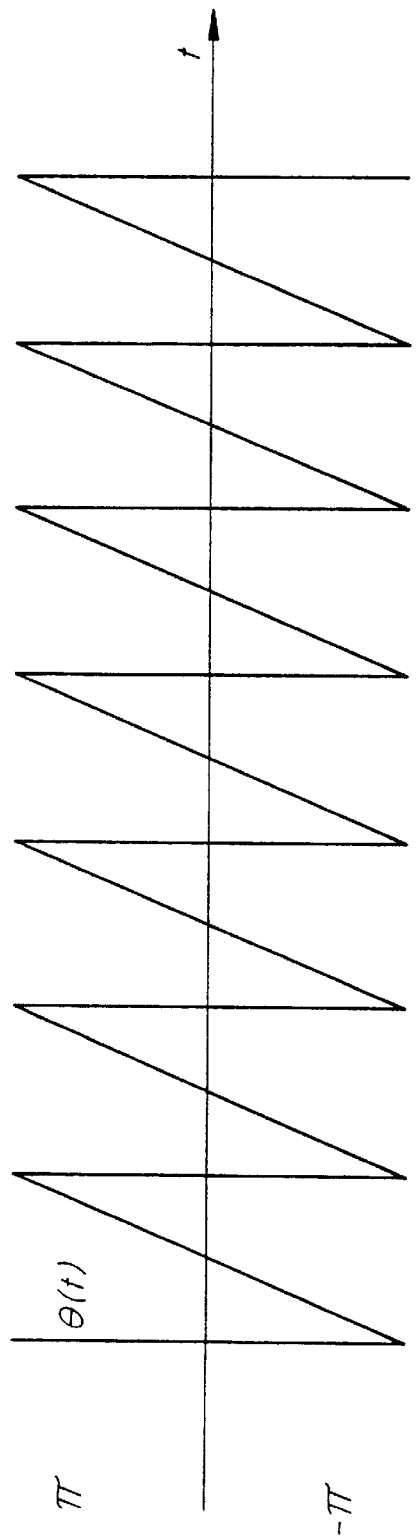
FIG. 2 shows functions $\theta(t)$ and $\phi(t)$.
Figure 2:
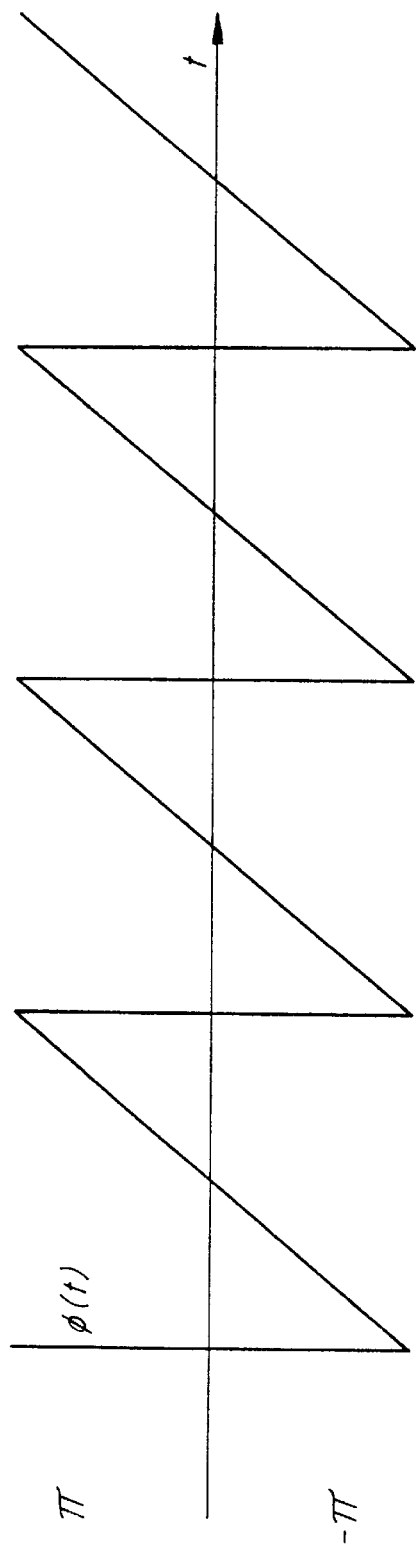

Since, $\theta(t)=2\phi(t)$, both functions resemble that of a sawtooth function. A simple sketch example of the two functions is shown in FIG. 2.

The function, $\theta(t)$, can be obtained by computing the arctangent of the ratio of the imaginary component to the real component of s(t). A computationally less expensive, but also less accurate, method can be used in some situations. In noiseless situations, having an estimate of $\theta(t)$, the function $\phi(t)$ can be estimated by dividing $\theta(t)$ by 2, removing every other phase wrap around and subtracting $\pi/2$ from the resulting function. In a noisy situation, however, this simple approach does not work well since many zero phase crossings could exist over consecutive samples. For this reason, a more complicated algorithm is used. This algorithm relies on first taking the derivative, $\theta'(t)$, of $\theta(t)$, detecting all zero phase transitions of $\theta(t)$ by locating the large peaks of $\theta'(t)$, and removing the zero phase transitions from $\theta x(t)$ by appropriately adding or subtracting $2\pi$ radians, producing the function, $\omega(t)$. The modulo-$2\pi$ integral of $\omega(t)/2$ can be used as an estimate of the first arbitrary phase angle $\phi(t)$. The function $e^{\Phi}(t)$ can be approximately obtained from the estimate of the first arbitrary phase angle $\hat{\phi}(t)$ with the help of a digital voltage-controlled oscillator implemented using a simple Look-up Table.

Figure 3:
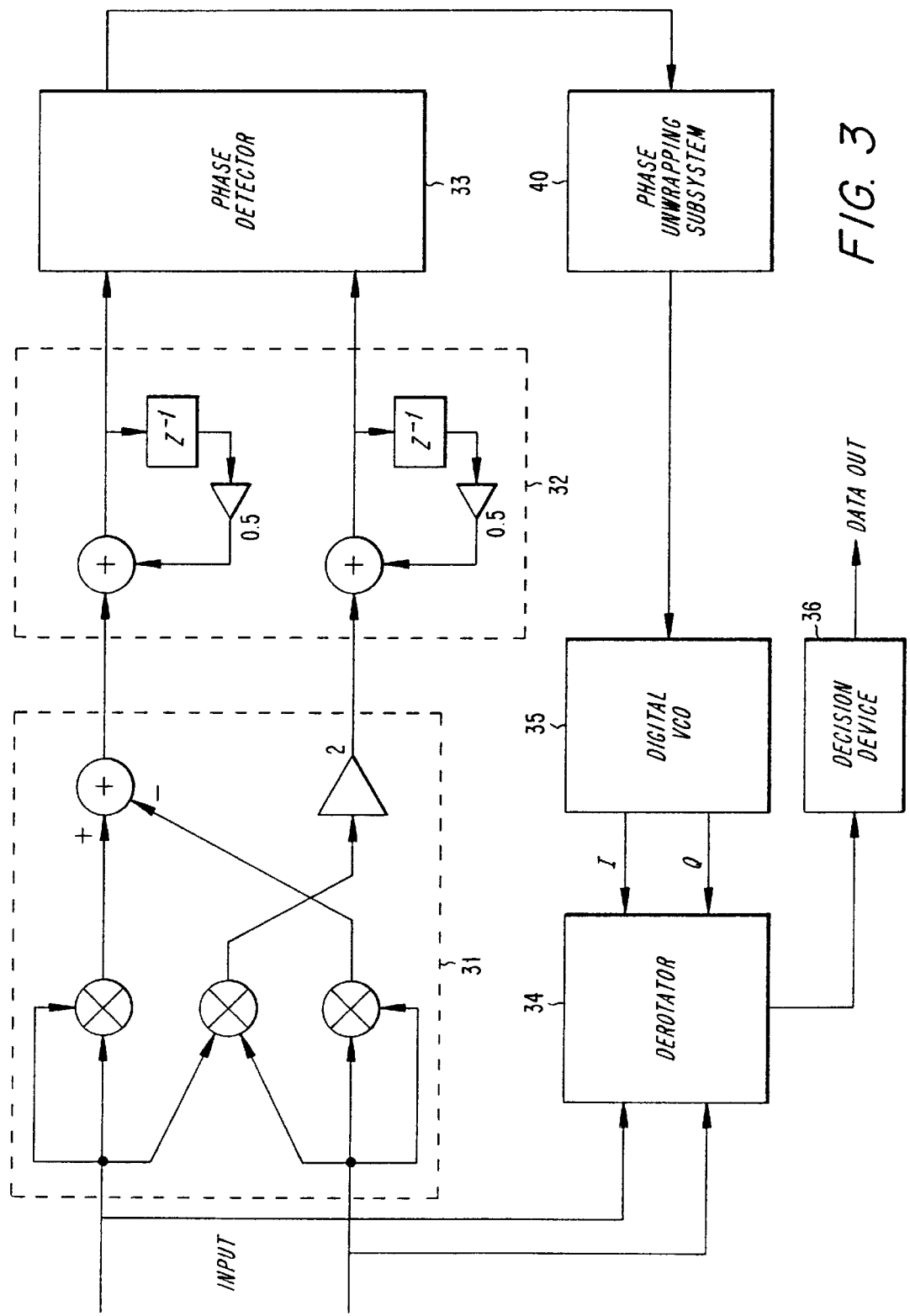
FIG. 3 is a block diagram of a digital receiver according to the present invention.
Figure 4:
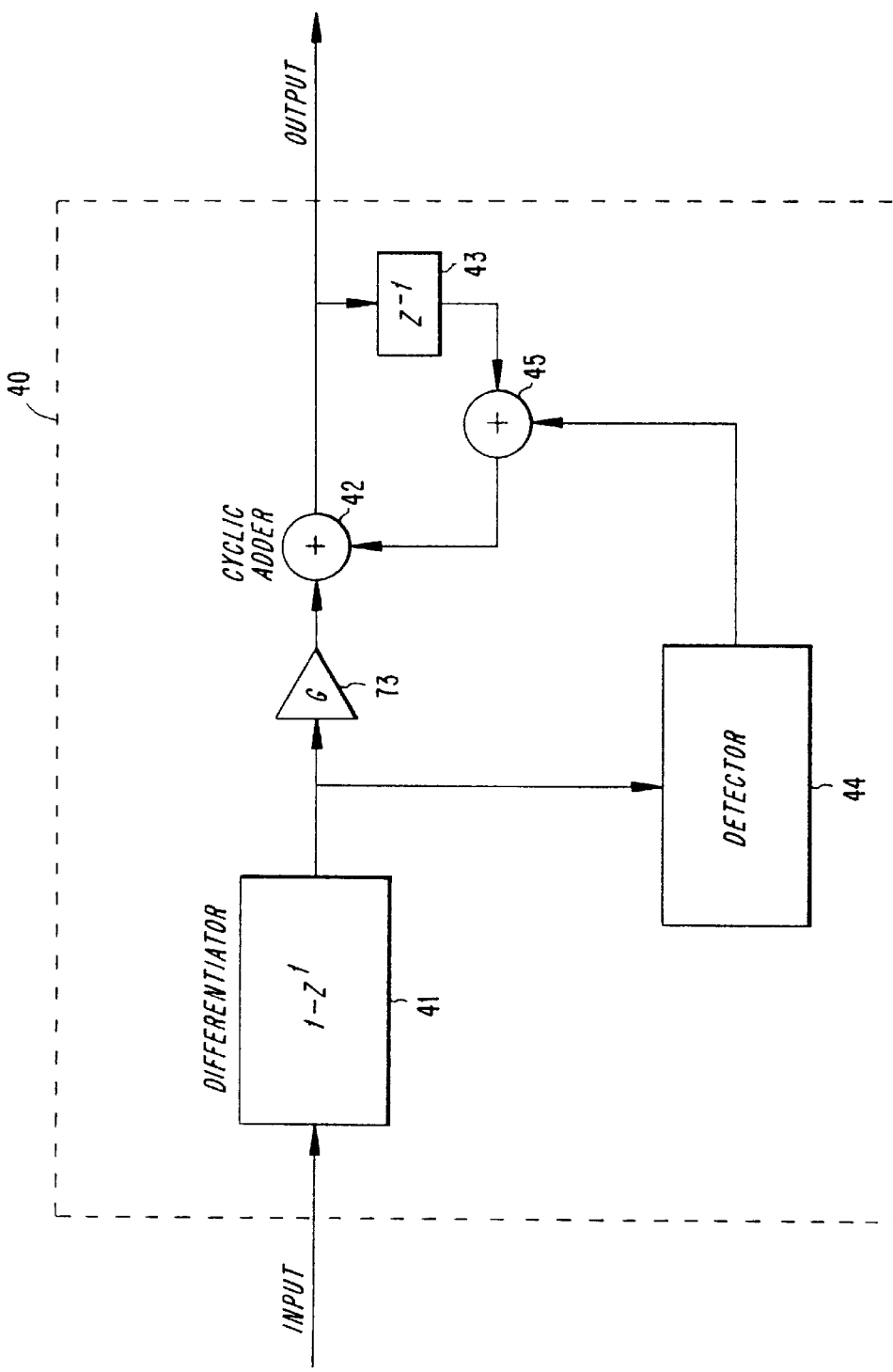
FIG. 4 is a block diagram of a phase unwrapping subsystem as used in the present invention.

The structure of the overall phase estimation system is shown in FIGS. 3 and 4. The inputs of the squaring device as implemented are the in-phase and quadrature-phase components of the received spread-spectrum signal. The input sampling rate is that of the transmission rate. The low pass filter shown is a simple single pole infinite impulse response (IIR) filter. The weight, shown by way of example in the figure as 0.5, was based on the ratio between the system Doppler and the transmitter bit rates. The phase detector computes the filtered vector angle, $\theta$ (t), to within a predetermined phase accuracy.

In the exemplary arrangement shown in FIG. 3, the digital receiver based on a squaring device is shown comprising the squaring device 31, a lowpass filter 32, a phase detector 33, a phase unwrapping subsystem 40, a digital voltage-controlled oscillator 35, a derotator 34 and a decision device 36.

The squaring device 31 is coupled between the input and the lowpass filter 32. The phase detector 33 is coupled between the lowpass filter 32 and the phase unwrapping subsystem 40. The digital voltage-controlled oscillator 35 is coupled between the derotator 34 and the phase unwrapping subsystem 40. The derotator 34 is connected to the input and to the decision device 36.

The squaring device 31 receives a spread-spectrum signal modulated with binary-phase-shift-keying (BPSK) modulation and having data, d(t), and the first arbitrary phase angle, $\phi(t)$, varying with time variable, t. The squaring device removes the BPSK modulation by squaring an in-phase component and a quadrature-phase component of the received spread-spectrum signal. The exemplary circuits shown in the squaring device 31 include a plurality of multipliers and summers and amplifiers. Squaring devices are well known to those skilled in the art.

The output of the squaring device 31 has the high frequency components removed by the lowpass filter 32. As shown in FIG. 3, the lowpass filter 32 may be embodied from components as used in digital circuitry. In a noiseless case, at the output of the lowpass filter is the second arbitrary phase angle, $\theta(t)$, proportional to the first arbitrary phase angle, $\phi(t)$, of the received spread-spectrum signal, such that $\theta(t)=2\phi(t)$.

The phase detector 33 estimates a value of $\theta$ proportional to the second arbitrary phase angle, $\theta(t)$, from the filtered in-phase component and the filtered quadrature-phase component of the received spread-spectrum signal as output by the lowpass filter 32. Since the slope of $\theta(t)$ is twice that of $\phi(t)$ and having twice as many zero crossings (phase wrap arounds), the value of the estimated e value output by the phase detector is passed to the phase unwrapping subsystem 40 for resolution of these differences.

The phase unwrapping subsystem is further shown in FIG. 4. Using FIG. 2 as an aid, it can be seen that the output of the differentiator 41 is a low level signal with occasional sharp positive and negative peaks which are due to the zero crossings of the input signal. The phase detector, using two thresholds set at plus and minus $\pi$ radians, detects these peaks. The cyclic adder 42 adds the output of the differentiator 41 after being divided by two, to the output of the combiner 45, to form the output of the phase unwrapping subsystem. If the content of the cyclic adder exceeds $\pi$ radians, it automatically subtracts $\pi$ radians, so that the output of the cyclic adder is always between minus and plus $\pi$. The detector output is '$\pi$ radians when its input exceeds $\pi$ radians, $\pi$ radians when its input is less than $-\pi$ radians, and zero otherwise.

The output of the phase unwrapping subsystem 40 is fed to the digital voltage-controlled oscillator 35. The digital voltage-controlled oscillator determines a cosine of the estimated $\phi$ value and a sine of the estimated $\phi$ value. The sine and cosine outputs of the digital voltage-controlled oscillator are passed to the derotator 34. The derotator derotates the in-phase component and the quadrature-phase component of the received spread-spectrum signal with the cosine of the estimated $\theta$ value and the sine of the estimated $\phi$ value to generate a demodulated signal. The demodulated signal is output by the derotator 34 and passes to the decision device 36. The decision device takes the demodulated signal as input and outputs data.

The phase unwrapping subsystem 40 as shown in FIG. 4 may include a differentiator 41, a amplifier 73, a cyclic adder 42, a delay device 43, a combiner 45, and a detector 44. The differentiator 41 is coupled between the input and the amplifier 73. The cyclic adder 42 is coupled to the delay device 43 and to the combiner 45. The detector 44 is coupled between the differentiator 41 and the combiner 45. The amplifier 73 preferably has a gain G of ½. Digitally, as is well known in the art, the amplifier 73 with a gain G of ½ is equivalent to shifting to the right.

In FIG. 4, the detector 44 typically has a double threshold which enables it to detect positive or negative changes larger than $\pi$ radians. Assuming these changes are due to crossing the zero phase, these changes can be removed by adding or subtracting $\pi$ radians to the integrator state.

Figure 5:
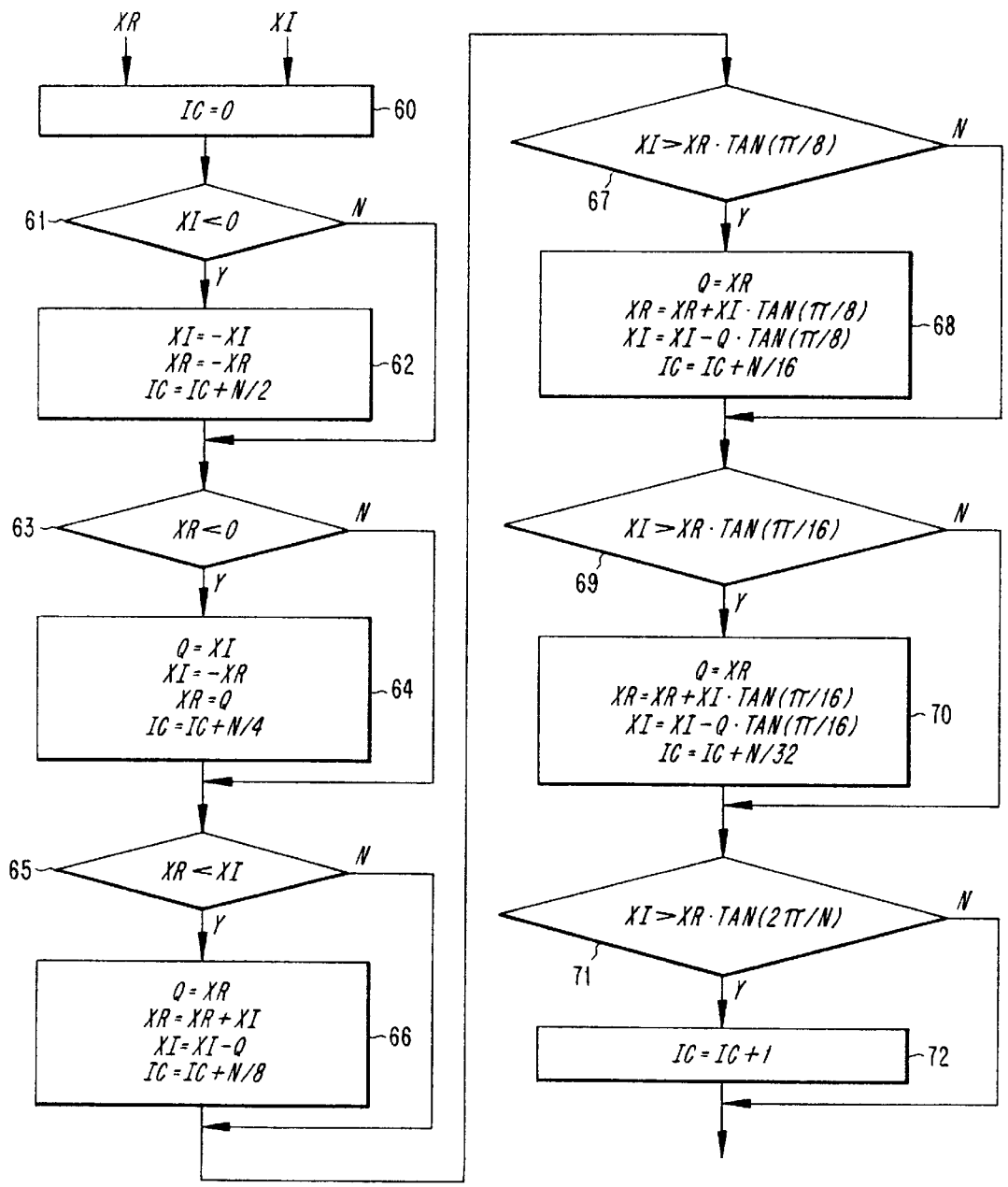
FIG. 5 is a flowchart of an N phase detector.

The flowchart of the phase detector algorithm is shown in FIG. 5, where N comparisons are needed to estimate the input vector phase to within $2\pi/N$ radians.

For the N phase detector of FIG. 5, the real component XR and the imaginary component XI, are initially input in step 60 into the system with the counter IC=0. The system first determines in step 61 if XI<0. If it is, then XI is set in step 62 to equal −XI, XR is set in step 62 to equal −XR, and the counter is incremented in step 62 to equal the initial count plus N/2. The system then determines in step 63 if XR is less than zero. If it is, then a value Q is set in step 64 to equal XI, XI is set in step 64 to equal −XR, XR is set in step 64 to equal Q, and the counter is incremented in step 64 by the count plus N/4. Next, the system determines in step 65 if XR is less than XI. If XR is less than XI, then the variable Q is set in step 66 to equal XR, XR is set in step 66 to equal XR+XI, XI is set in step 66 to equal XI-Q, and the counter is incremented in step 66 by the original count plus N/8. The system then determines in step 67 if XI is greater than XR·TAN($\pi/8$). If XI is greater than XR·TAN($\pi/8$), then the variable Q is set in step 68 to equal XR, XR is set 68 to equal XR+XI·TAN($\pi/8$), XI is set in step 68 to equal XI−Q·TAN ($\pi/8$), and the counter is incremented in step 68 by the count plus N/16. For the next test, the system determines in step 69 if XI is greater than XR·TAN($\pi/16$). If XI is greater than XR·TAN($\pi/16$), then the variable Q is set in step 70 to equal XR, XR is set in step 70 to equal XR+XI·TAN($\pi/16$), XI is set in step 70 to equal X−Q·TAN($\pi/16$), and the counter is incremented in step 70 by the original count plus N/32. This process continues until XI is greater than XR·TAN($2\pi/N$). When the system determines in step 71 that XI is greater than XR·TAN($2\pi/N$), then the counter is set in step 72 to equal the count plus 1.

Representative results were obtained by estimating the received information signal phase to within $2\pi/16$ radians. A Look-up Table with a digital voltage-controlled oscillator having the ability to produce the sine and cosine functions at 32 points evenly spaced on the unit circle may be used. An example of a Look up Table suitable for use with the present invention is shown in Table I.

TABLE I

32 POINT DIGITAL-VCO INPUT/OUTPUT

| INPUT | COSINE | SINE |
|---|---|---|
| −16 | −15 | −1 |
| −15 | −15 | −4 |
| −14 | −14 | −7 |
| −13 | −12 | −10 |
| −12 | −10 | −12 |
| −11 | −7 | −14 |
| −10 | −4 | −15 |
| −9 | −1 | −15 |
| −8 | 1 | −15 |
| −7 | 4 | −15 |
| −6 | 7 | −14 |
| −5 | 10 | −12 |
| −4 | 12 | −10 |
| −3 | 14 | −7 |
| −2 | 15 | −4 |
| −1 | 15 | −1 |
| 0 | 15 | 1 |
| 1 | 15 | 4 |
| 2 | 14 | 7 |
| 3 | 12 | 10 |
| 4 | 10 | 12 |
| 5 | 7 | 14 |
| 6 | 4 | 15 |
| 7 | 1 | 15 |
| 8 | −1 | 15 |
| 9 | −4 | 15 |
| 10 | −7 | 14 |
| 11 | −10 | 12 |
| 12 | −12 | 10 |
| 13 | −14 | 7 |
| 14 | −15 | 4 |
| 15 | −15 | 1 |

Because of the high symmetry of the sine and cosine trigonometric functions, this information can be greatly condensed.

Beyond the accuracy of $\pi/16$ radians there were no additional gains, since the system at small Dopplers demonstrated a performance very close to that achieved with an optimum BPSK receiver. The $\pi/16$ radians requirement of the digital voltage-controlled oscillator allowed the phase detector 33 to determine the phase of its input vector to within $\pi/8$ accuracy, due to the phase doubling by the squaring device 31.

With the phase detector 33, phase unwrapping subsystem 40 and digital voltage-controlled oscillator 35 being fixed, the system performance was evaluated utilizing a variety of low pass filter structures. In the results representatively obtained, and as illustrated in FIGS. 6–14, a PG=256 in a 20 MHz system was assumed.

Figure 6:
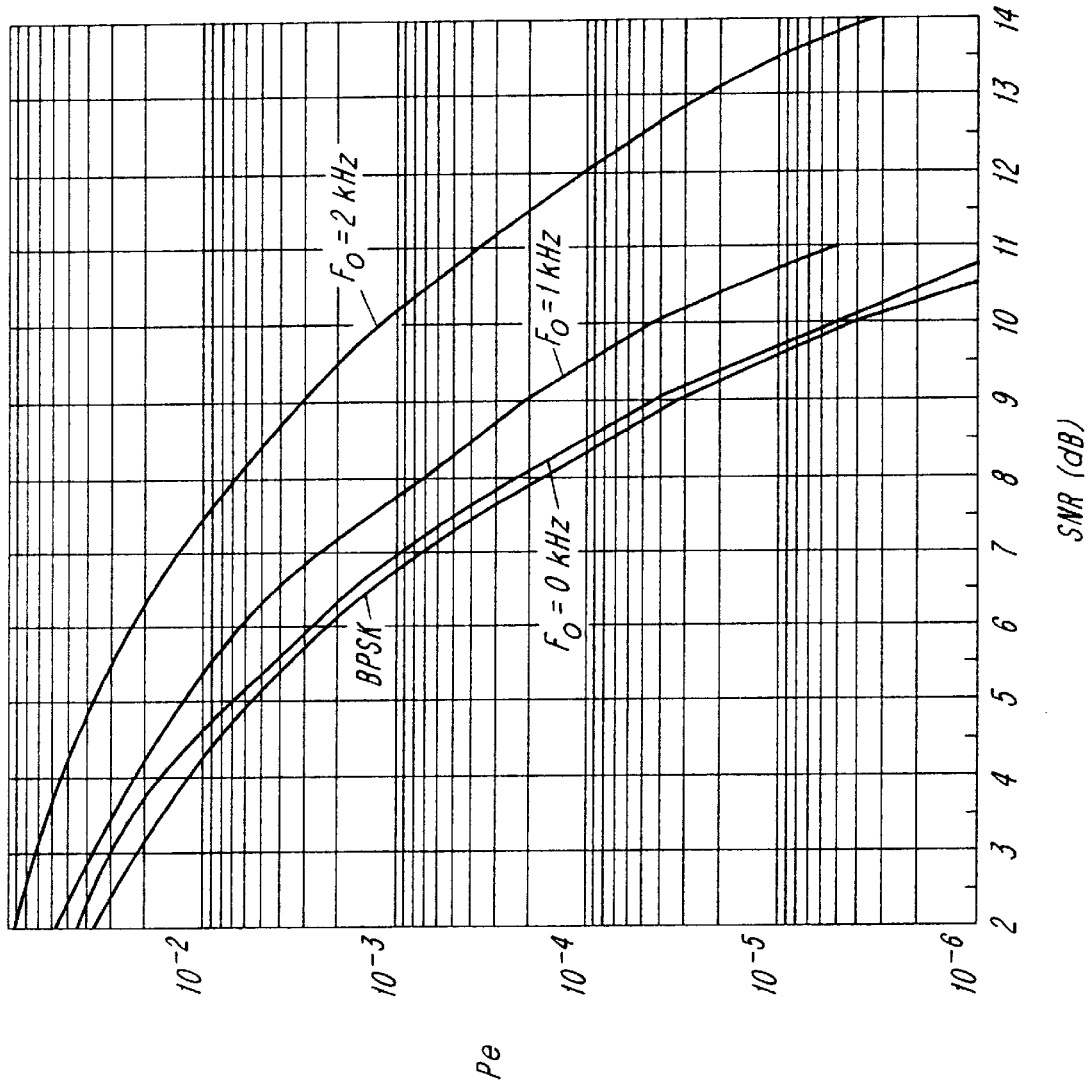
FIG. 6 illustrates phase estimation performance using square law for a filter having a rectangular window of length 8.

The first set of filters tried were simple finite-time integrators. FIG. 6 shows the system bit error rate (BER) when the low pass filter averages over 8 consecutive samples, i.e., the filter impulse response is h(n)=1 for n=0, 1, . . ., 7, and zero elsewhere. In all figures that follow, the lowest left curve corresponds to that of an ideal BPSK system. In FIG. 6, the remaining curves were obtained using the above-described algorithm when the Doppler was set at 0, 1 and 2 kHz. At 0 kHz Doppler, the system behaves in a manner very similar to that of an ideal BPSK receiver. However, the loss at 1 kHz is about 1 dB and at a 2 kHz Doppler, about 3.5 dB. This illustrates that tight filtering is good for small Doppler offsets, but detrimental to large Doppler offsets. A wider bandwidth filter may be used to retain the small Doppler performance of FIG. 6, while allowing for larger Doppler offsets.

Figure 7:
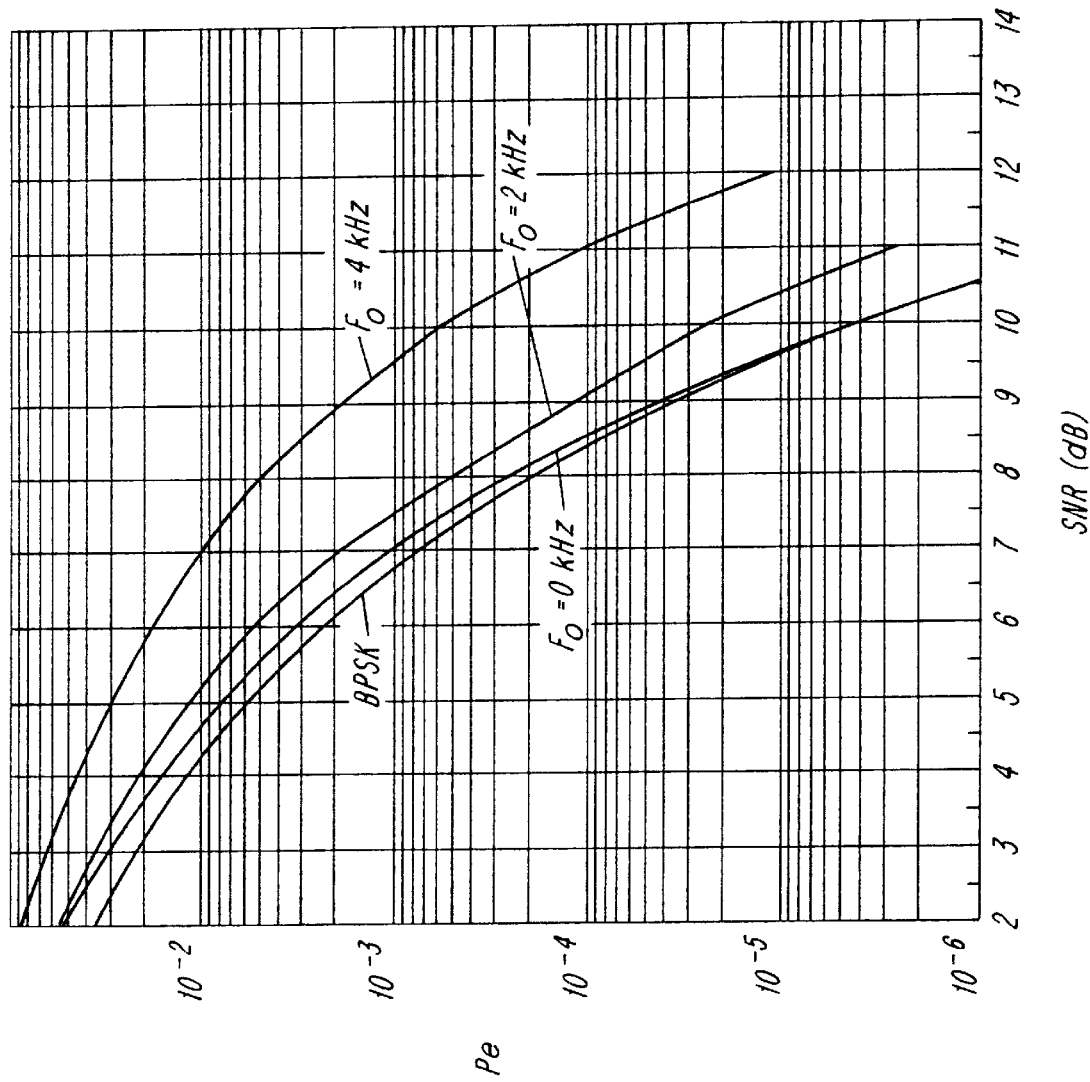
FIG. 7 illustrates phase estimation performance using square law for a filter having a rectangular window of length 4.

In FIG. 7, the same type of filter was used with a length reduced to 4, i.e., h(n)=1 for n=0, 1, . . ., 3, and zero elsewhere. Again, the zero Doppler performance is within 1/4 dB from that of an ideal BPSK receiver. The loss at 2 kHz Doppler is about 3/4 dB.

Figure 8:
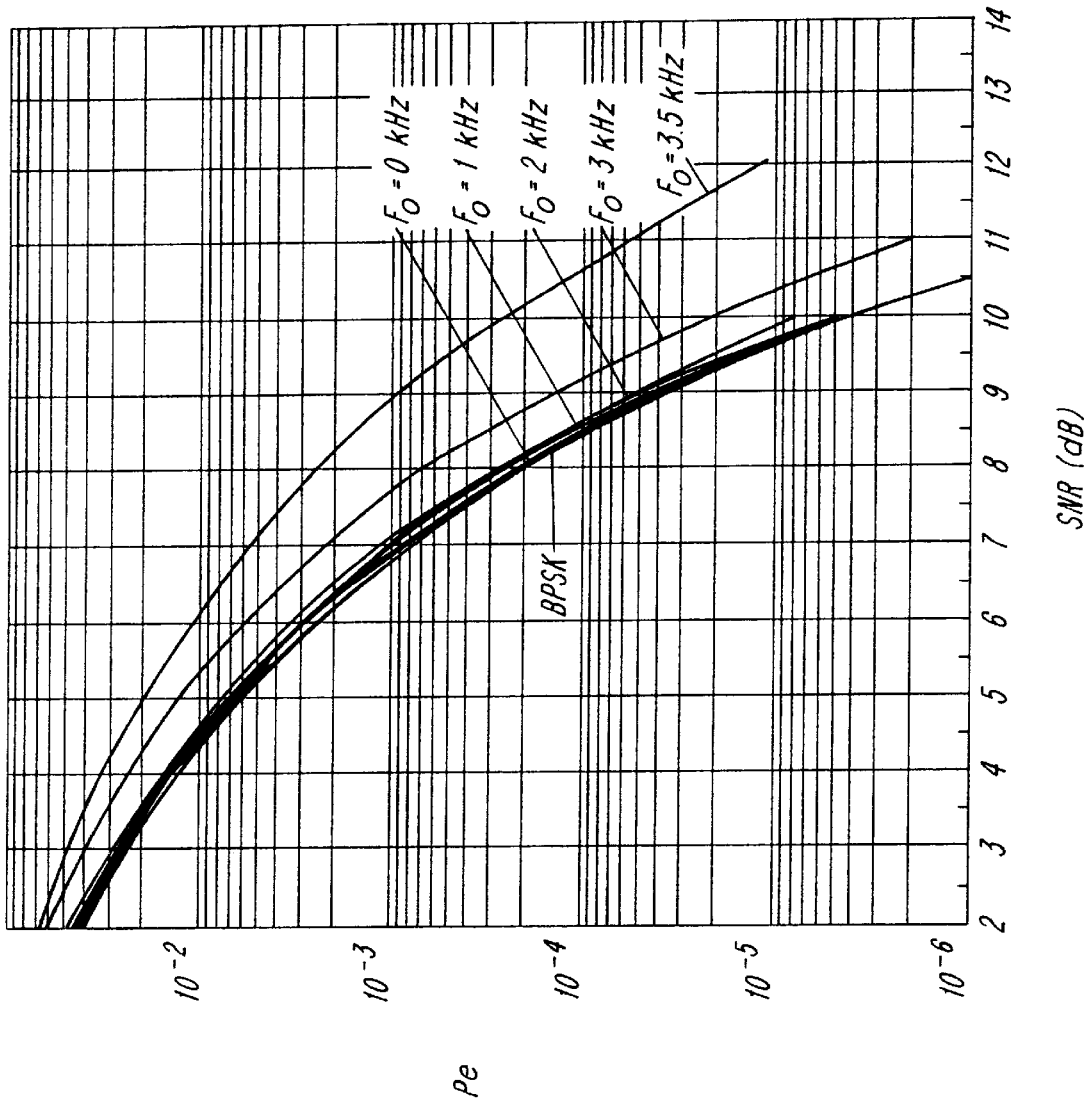
FIG. 8 illustrates phase estimation performance using square law for a filter having a Hamming window of length 11.

The next family of low pass filters tried were Hamming windows of length N centered at zero. Their lengths N were odd numbers and necessitated a delay of (N−1)/2 samples. FIG. 8 shows the system BER performance when N=11 and with Doppler offsets of 0, 2, 3, and 3.5 kHz. This system presents a very good BER performance of up to 3 kHz with a loss of less than 1/4 dB at a BER of $10^{-4}$.

Figure 9:
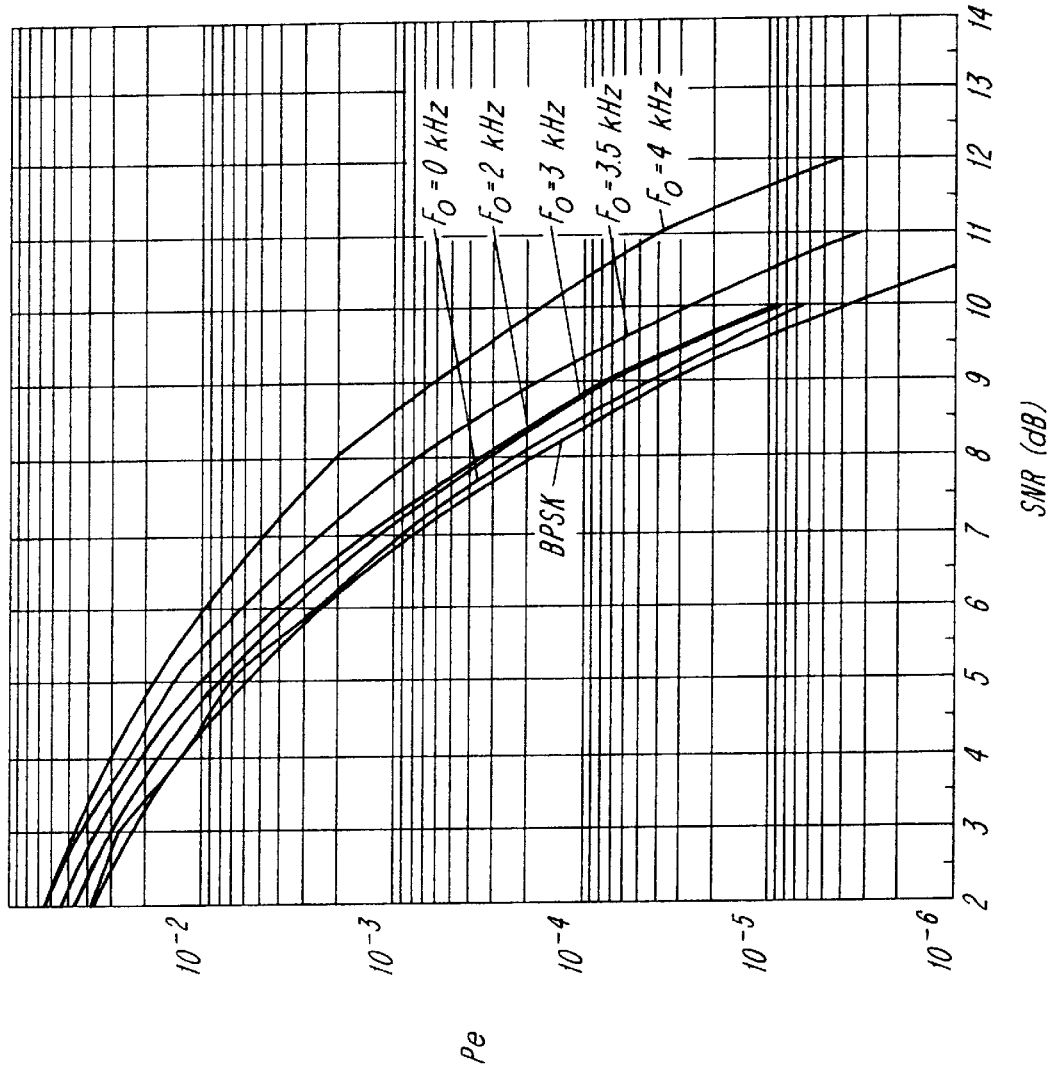
FIG. 9 illustrates phase estimation performance using square law for a filter having a Hamming window of length 7.

FIG. 9 shows the system performance when the Hamming window length was reduced to 7. In this case, the loss at 2 kHz is slightly higher than 1/4 dB and less than 1/2 dB at a 3 kHz Doppler. This type of filter presents a good performance at high Doppler offsets. The drawbacks of this type of filter include complex implementation requirements and the presence of an undesirable delay. This delay is particularly undesirable in the operation of the APC algorithm.

Figure 10:
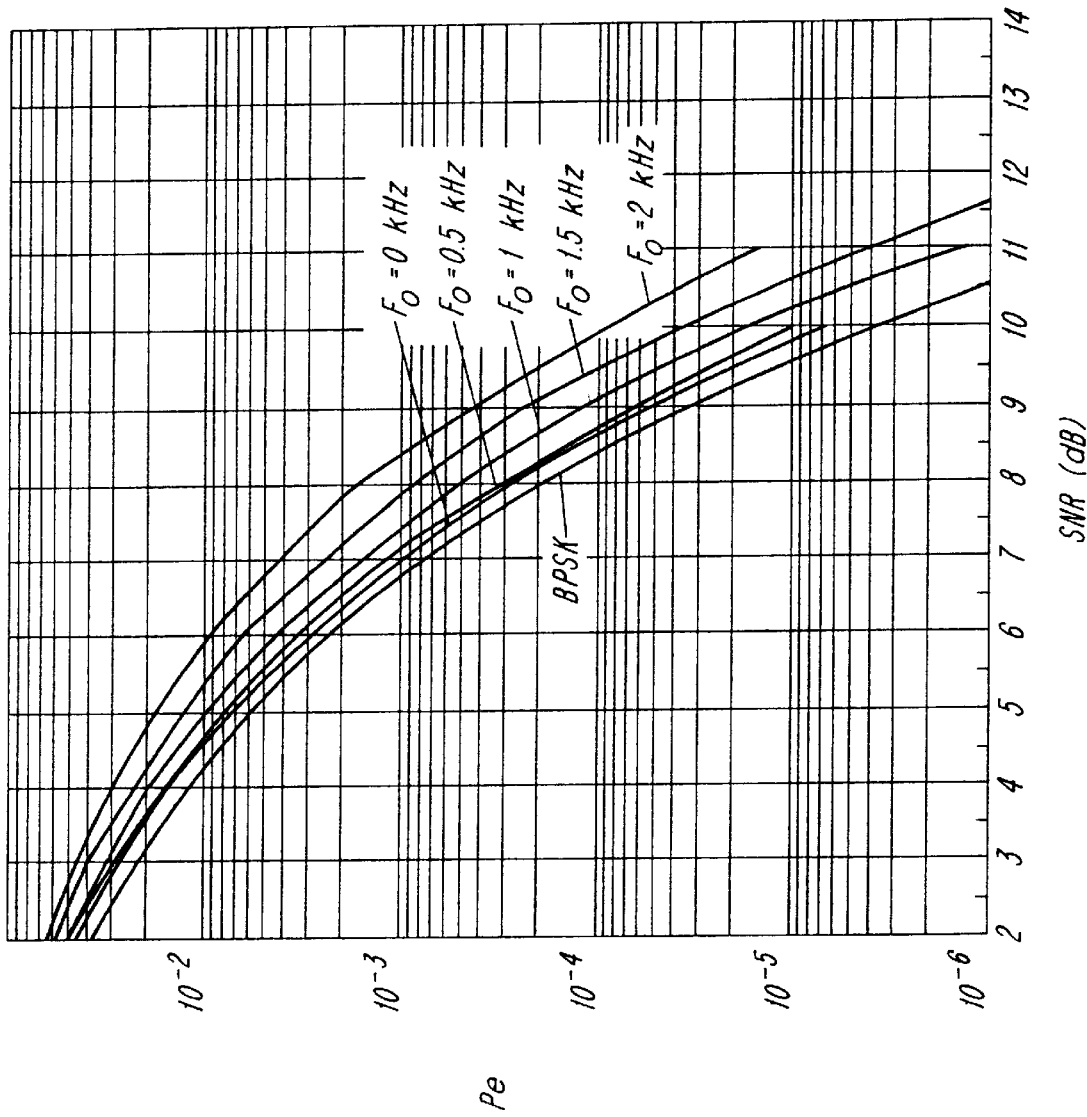
FIG. 10 illustrates phase estimation performance using square law for a filter having h(n)=1.4 −0.2n and no delay.
Figure 11:
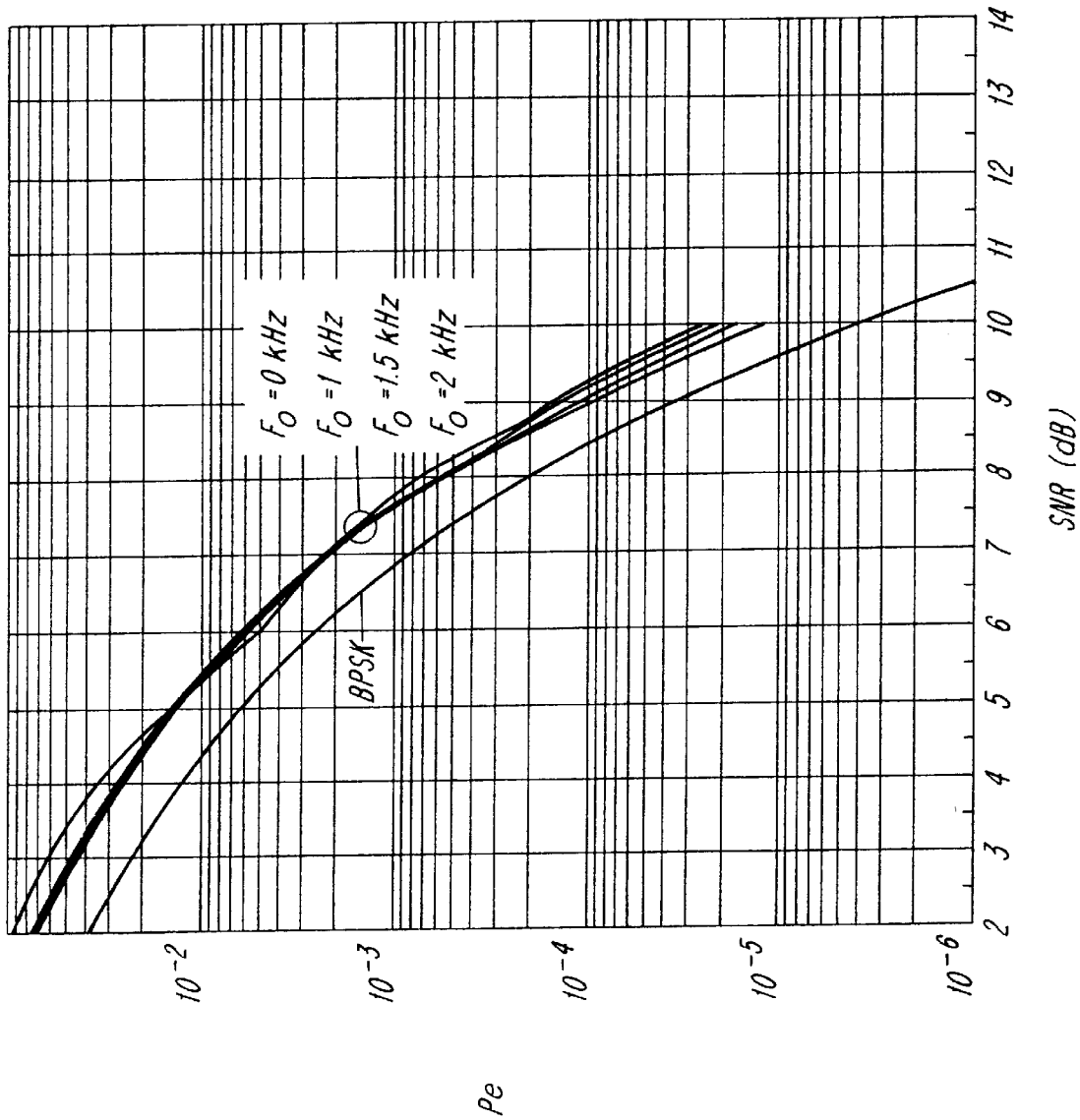
FIG. 11 illustrates phase estimation performance using square law for a filter having $h(n)=(0.25)^n$ and no delay.

The next filter tried was one having an impulse response given by h(n)=1.4 =0.2n, for n=0, 1, . . ., 6, and zero elsewhere. The BER performance of this filter is shown in FIG. 10. A loss of about 1/4 dB was obtained at a Doppler offset of 500 Hz and a loss of almost 3/4 dB was demonstrated at a 1 kHz Doppler offset.

Figure 12:
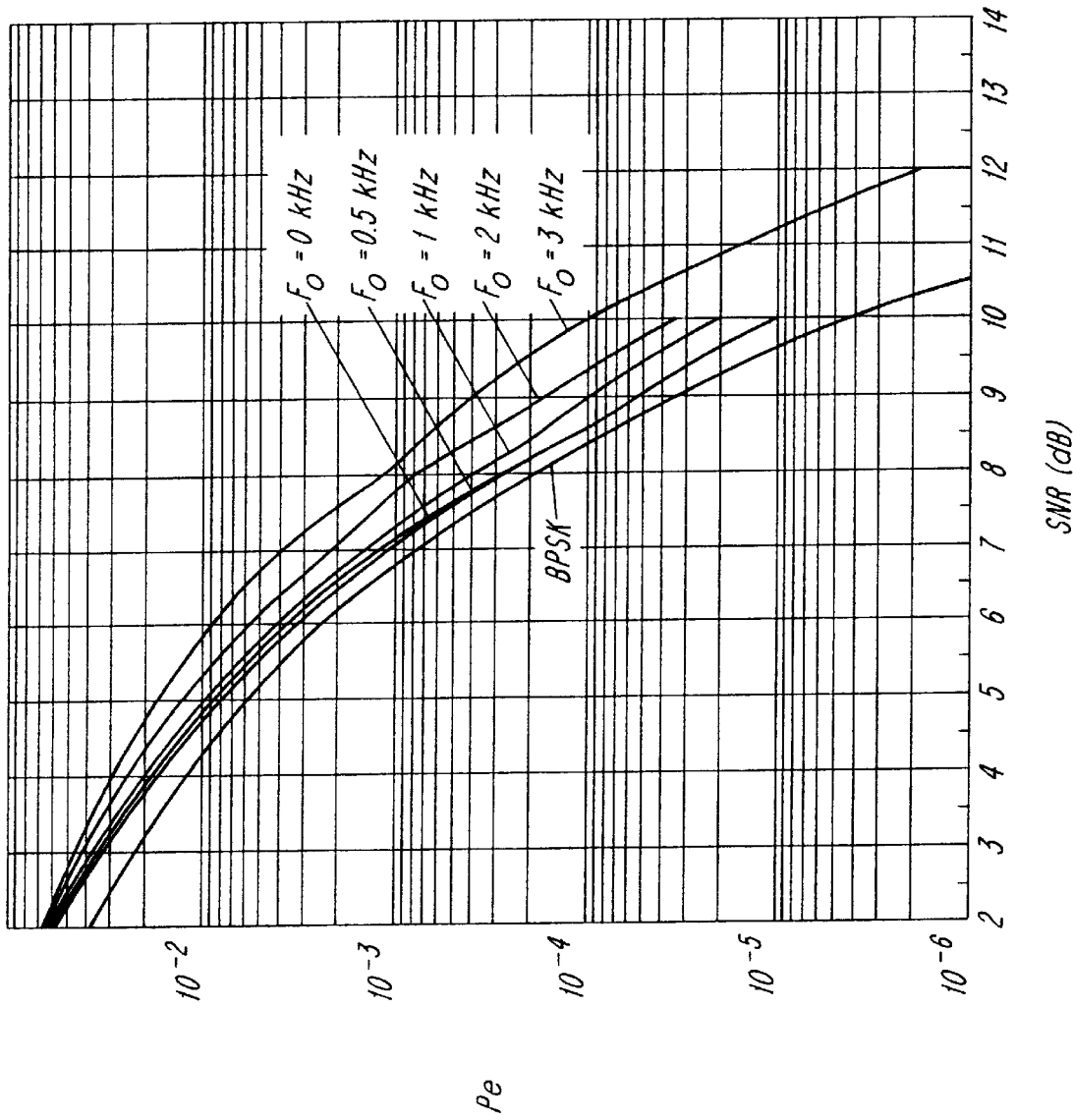
FIG. 12 illustrates phase estimation performance using square law for a filter having $h(n)=(0.5)^n$ and no delay.
Figure 13:
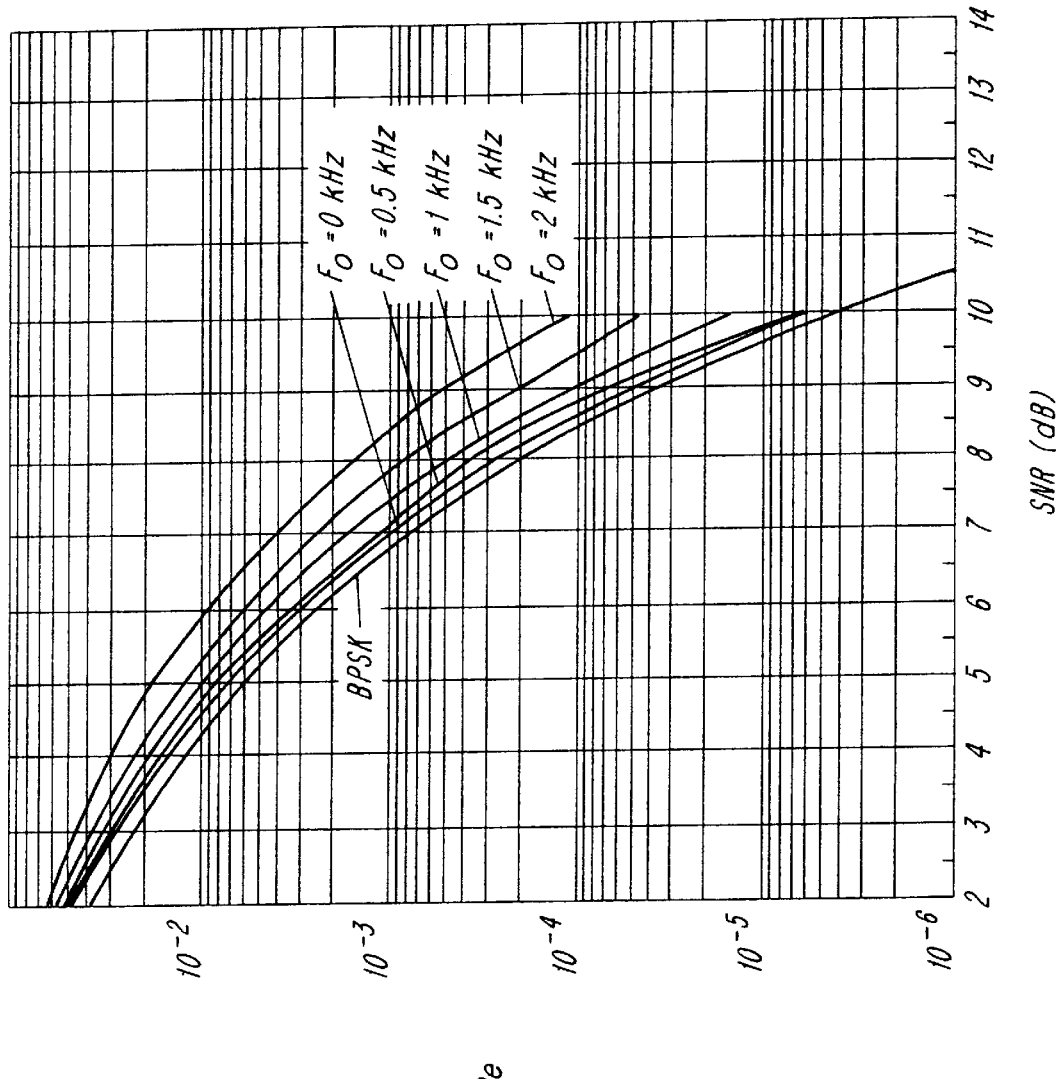
FIG. 13 illustrates phase estimation performance using square law for a filter having $h(n)=(0.75)^n$ and no delay.
Figure 14:
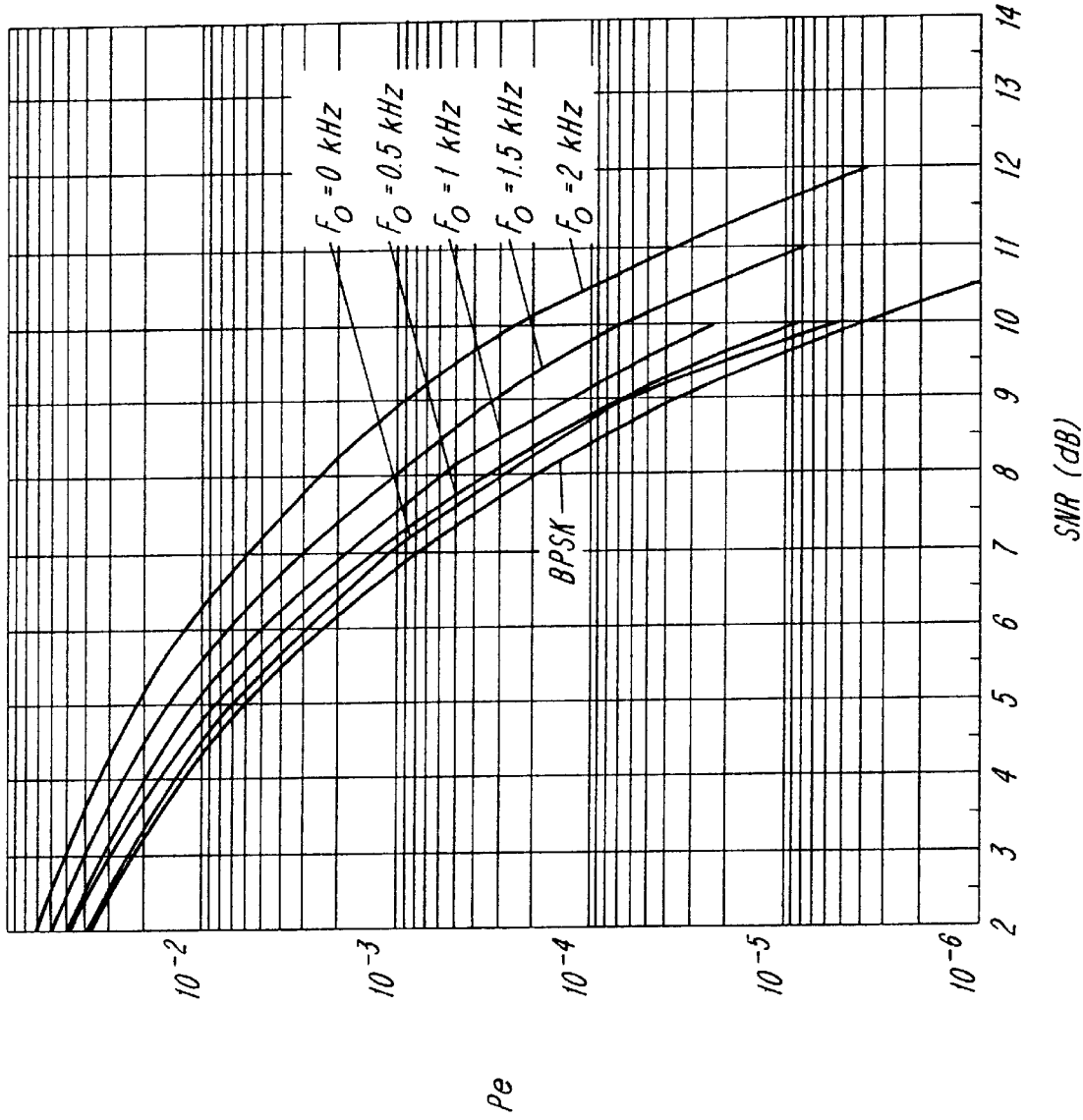
FIG. 14 illustrates phase estimation performance using square law for a filter having $h(n)=(0.875)^n$ and no delay.

The next set of filters tried were exponentially decaying low pass filters of finite length. In all cases, the filters impulse responses were given by $h(n)=\alpha^n$, for n=0, 1, . . ., 6, and zero elsewhere. For $\alpha \leq 0.5$, a single pole IIR configuration can be used. FIGS. 11, 12, 13 and 14 show the system BER performance for $\alpha=0.75$ and 0.875. The effect of the parameter a is to control the amount of filtering. Small a filters perform poorly at small Doppler offsets and very well at large offsets. The opposite is true for large $\alpha$ filters. In FIG. 12, the system performed approximately the same for all Doppler offsets below 2 kHz. The loss in dB is about 1 dB.

In FIG. 12, the loss is about 0.25 dB at 500 Hz and less than 0.5 dB at 1 kHz. Increasing $\alpha$ to 0.75 and 0.875 increases the loss at 1 kHz to about 0.5 dB and 0.8 dB, respectively. This data indicates that from the exponentially decaying windows, the best compromise is obtained with the parameter $\alpha$ set at 0.5. This also allows the use of a simple IIR filter structure for the same performance.

It will be apparent to those skilled in the art that various modifications can be made to the fast acting Costas loop of the instant invention without departing from the scope or spirit of the invention, and it is intended that the present invention cover modifications and variations of the fast acting Costas loop provided they come within the scope of the appended claims and their equivalents.

We claim:

1. A method for synchronizing a Costas Loop for demodulating a received spread-spectrum signal having data, d(t), a chip sequence, g(t), and a first arbitrary phase angle, $\phi(t)$, varying with time variable, t, in a receiver generating an in-phase component and a quadrature-phase component of the received spread-spectrum signal, comprising the steps of:

a. generating a second arbitrary phase angle, $\theta(t)$, proportional to the first arbitrary phase angle, $\phi(t)$;

b. estimating a $\theta$ value proportional to the second fit arbitrary phase angle, $\phi(t)$, from the in-phase component and the quadrature-phase component of the received spread-spectrum signal;

c. processing the estimated $\theta$ value, thereby obtaining an estimate of the $\phi$ value;

d. determining a cosine of the estimated $\phi$ value and a sine of the estimated $\phi$ value;

e. derotating the in-phase component and the quadrature-phase component of the received spread-spectrum signal with the cosine of the estimated $\phi$ value and the sine of the estimated $\phi$ value to generate a demodulated signal; and f. deciding data from the demodulated signal.

2. The method as set forth in claim 1, with the step of estimating a $\theta$ value including the step of determining an arctangent of the in-phase component and the quadrature-phase component of the received spread-spectrum signal.

3. An improvement for synchronizing a Costas loop for demodulating an in-phase component and a quadrature-phase component of a received spread-spectrum signal having data, d(t), and an arbitrary phase angle, $\phi(t)$, varying with time variable, t, the improvement comprising:

means for generating an arbitrary phase angle, $\theta(t)$, proportional to the arbitrary phase angle, $\phi(t)$;

means for estimating a $\theta$ value proportional to the phase angle, $\theta(t)$, from the in-phase component and the quadrature-phase component;

means for processing the estimated $\theta$ value, thereby obtaining an estimate of the $\phi$ value;

means for generating a cosine of the estimated $\phi$ value and a sine of the estimated $\phi$ value;

means for derotating the in-phase component and the quadrature-phase component of the received spread-spectrum signal with the cosine of the estimated $\theta$ value and the sine of the estimated $\theta$ value, to generate a demodulated signal; and means for deciding data from the demodulated signal.

4. The improvement as set forth in claim 3, with said means for estimating the e value including a phase detector.

5. The improvement as set forth in claim 3, with said means for processing including a phase unwrapping subsystem.

6. The improvement as set forth in claim 3 with said means for generating a cosine and a sine including a voltage controlled oscillator.

7. The improvement as set forth in claim 3 with said means for derotating including a derotator.

8. The improvement as set forth in claim 3, with said means for deciding including a decision device.

9. An improvement for synchronizing a Costas loop for demodulating an in-phase component and a quadrature-phase component of a received spread-spectrum signal having data, d(t), and an arbitrary phase angle, $\phi(t)$, varying with time variable, t, in a receiver generating an in-phase component and a quadrature-phase component of the received spread-spectrum signal, the improvement comprising:

a filter for filtering the in-phase component and the quadrature-phase component of the received spread-spectrum signal and for generating an arbitrary phase angle, $\theta(t)$, proportional to the arbitrary phase angle, $\phi(t)$;

a phase detector, coupled to said filter, for estimating a $\theta$ value proportional to the phase angle, $\theta(t)$, from the filtered in-phase component and the filtered quadrature-phase component of the received spread-spectrum signal;

a phase unwrapping subsystem, coupled to said phase detector, for processing the estimated $\theta$ value, thereby obtaining an estimate for the $\phi$ value;

an oscillator, coupled to said phase unwrapping subsystem, for generating a cosine of the estimated $\phi$ value and a sine of the estimated $\phi$ value;

a derotator, coupled to said oscillator, for derotating the in-phase component and the quadrature-phase component of the received spread-spectrum signal with the cosine of the estimated $\phi$ value and the sine of the estimated $\phi$ value, thereby generating a demodulated signal; and a decision device, coupled to said derotator, for outputting data from the demodulated signal.

10. The improvement as set forth in claim 9, with said filter including simple finite-time integrators.

11. The improvement as set forth in claim 9, with said filter including Hamming windows.

12. The improvement as set forth in claim 9, with said filter including exponentially decaying lowpass filters of finite length.

* * * * *